United States Patent
Law et al.

[19]

[11] Patent Number: 6,154,159
[45] Date of Patent: Nov. 28, 2000

[54] ELECTRONIC SAMPLING CIRCUIT

[75] Inventors: Derek Law, Watford; Graham A. Fuggle, North Harrow; Stephen J. Edwards, Pinner, all of United Kingdom

[73] Assignee: Eastman Kodak Company, Rochester, N.Y.

[21] Appl. No.: 09/129,815

[22] Filed: Aug. 6, 1998

[30] Foreign Application Priority Data

Aug. 16, 1997 [GB] United Kingdom .................... 9717324

[51] Int. Cl.$^7$ ...................................... H03M 1/00
[52] U.S. Cl. ............................................ 341/122; 341/155
[58] Field of Search ................................... 341/122, 131, 341/132, 139, 141, 143

[56] References Cited

U.S. PATENT DOCUMENTS

| | | | |
|---|---|---|---|
| 4,573,033 | 2/1986 | Kolodin | 340/347 |
| 4,700,173 | 10/1987 | Araki et al. | 340/347 |
| 4,845,498 | 7/1989 | Kubo et al. | 341/131 |
| 4,982,193 | 1/1991 | Saul | 341/159 |
| 5,231,397 | 7/1993 | Ridkosil | 341/155 |
| 5,309,183 | 5/1994 | Sasaki et al. | 348/233 |
| 5,917,440 | 6/1999 | Khoury | 341/143 |

*Primary Examiner*—Brian Young
*Attorney, Agent, or Firm*—Clyde E. Bailey, Sr.

[57] ABSTRACT

An electronic sampling circuit for determining redox potentials, and consequently specie concentration, in a photographic solution, applies a linear ramp of a square wave voltage to a first electrode (6) immersed in the solution. The current drawn by an adjacent electrode (12) is converted to a voltage for sampling. A pair of sample-and-hold circuits (40,42) store signals sampled at the peak and adjacent trough respectively of a square wave pulse, and a subsequent analogue difference circuit (44) subtracts the two signals. The resulting signal is converted to a digital code by a low cost, low bit count analogue-to-digital converter (46), which is stored on a microprocessor (48). The sampling process is repeated for successive square waves along the ramp. This circuit configuration enables the difference between analogue signals to be measured where the signals differ in amplitude by small amounts but have a wide dynamic range, without the need for an expensive, high bit count analogue-to-digital converter.

5 Claims, 2 Drawing Sheets

ELECTRONIC SAMPLING CIRCUIT

FIELD OF THE INVENTION

This invention relates to sampling an analogue electrical signal and storing a value in digital form that is representative of the change of the analogue signal.

BACKGROUND OF THE INVENTION

Sampling of electrical signals is carried out for a large variety of reasons. One application is in the study of chemical reducing or oxidizing reactions in photographic solutions in order to determine the redox potentials, which are proportional to the concentration of various components, or species, therein.

An electronic sampling circuit is known using square-wave voltametry, in which current drawn by an electrode immersed in an electrolyte is sampled at the top and bottom of each pulse of a voltage square wave signal applied as a linear sweep across the electrolyte. The voltage square wave is progressively increased by predefined increments and the successive currents from the electrode are analyzed. FIG. 1 of the accompanying drawings shows the waveform of the applied voltage signal. FIG. 2 of the drawings shows a block diagram of the known sampling circuit. Referring to FIGS. 1 and 2, the voltage square wave represented in FIG. 1 is applied to a three-electrode geometry potentiostat system 2 of FIG. 2. The potentiostat 2 uses an amplifier 4 to amplify the applied signal before it reaches a counter electrode immersed in an electrolyte 8 in test cell 10. Current flow in the liquid 8 is collected at a working electrode 12 and conducted to an input terminal 14 of a current-to-voltage converter/amplifier 16 to provide an output signal on path 18 that is a measure of the electrolyte current, in square-wave form. The terminal 14 of the converter/amplifier 16 is maintained at virtual earth potential, and a third electrode, reference electrode 20, immersed in the electrolyte 8 between the counter and working electrodes 6,12, forms a feedback loop via an amplifier 22 to another input terminal of the amplifier 4. The measured voltage signal on the path 18 is fed to a sample-and-hold circuit 24. Initially, sampling takes place at Sample Point 1, the peak of the first square wave pulse of the measured current as shown in FIG. 1. This value is converted to a digital code by an analogue-to-digital converter (A/D) 26 prior to being stored in a microprocessor 28. The input signal on path 18 is then sampled by the circuit 24 at Sample Point 2, the trough of the first square wave pulse of the measured current as shown in FIG. 1, converted to a digital signal by the converter 26 and stored in the microprocessor 28. Once both of these values are stored, they are subtracted using software in the microprocessor 28 to produce a difference signal that is representative of the current flowing in the electrolyte in response to the applied square-wave voltage. This measurement is then repeated for each pulse of the square wave on the ramp for, say, 1000 readings, or more.

PROBLEM TO BE SOLVED BY THE INVENTION

The input currents from the ramp of the sampling system described with reference to FIGS. 1 and 2 are typically in the wide range from 15 nA to 2 mA, whereas the circuitry also needs to be able to resolve the very much narrower range, typically of the order of one thousandth that of the entire ramp, of the two sample points on each square wave with a high degree of precision. These requirements necessitate the use of an analogue-to-digital converter with 18 bits, or more, which is not only expensive in itself, but also requires low noise, high precision components in the rest of the circuitry. This adds further to the expense and to the complication of the sampling system.

SUMMARY OF THE INVENTION

It is one object of the present invention to provide circuit sampling that enables the use of lower cost and lower bit count analogue-to-digital converters for the measurement of the difference between two, or more, analogue signals.

In accordance with one aspect of the present invention, there is provided an electronic sampling circuit comprising:
  first and second circuit means arranged repetitively to receive and to store a first and a successive second analogue input signal respectively;
  means arranged to subtract each of said first and successive second signals from one another and to derive successive difference signals therefrom;
  means arranged to convert the analogue difference signals into digital signals; and
  electronic processing means arranged to receive and to store the successive digital signals.

Each of said first and second circuit means may comprise a sample-and-hold circuit.

The electronic processing means preferably comprises a microprocessor.

The analogue-to-digital conversion means may comprise an 8-bit analogue-to-digital converter.

In accordance with another aspect of the resent invention, there is provided a method of sampling an analogue signal, wherein
  (a) the signal is sampled at two different times,
  (b) a signal representing the difference in value therebetween is derived and passed to analogue-to-digital conversion means,
  (c) the digital signal derived in step (b) is stored, and
  (d) steps (a), (b), and (c) are repeated so as to store a succession of digital signals that are representative of a change in value of the analogue signal.

ADVANTAGEOUS EFFECT OF THE INVENTION

Sampling in accordance with the present invention, in particular using two sample-and-hold arrangements, requires an analogue-to-digital converter having an input range that is no greater than the values of current from a single pulse, usually square wave, since the sample-and-hold circuits remove the large range of the ramp. The lower, for example 8 bit, range of the smaller analogue-to-digital converter that is now sufficient, can produce the same precision as a 12 bit converter needed in the known arrangement. Furthermore, the complexity of the circuit is reduced because the smaller converter is less sensitive to noise.

Low bit count analogue-to-digital converters are standard fitment on some families of microprocessors, thus reducing the cost and component count even further.

Processing times of the signals are greatly increased since the subtraction of the signals is achieved in hardware rather than in software, and also, fewer bit manipulations in software have to be carried since smaller digital codes need be used.

A more versatile sampling system can be achieved, since the circuit configuration can be easily altered to operate over wider input voltage ranges without compromising overall resolution.

DETAILED DESCRIPTION OF THE INVENTION

Figure 1:
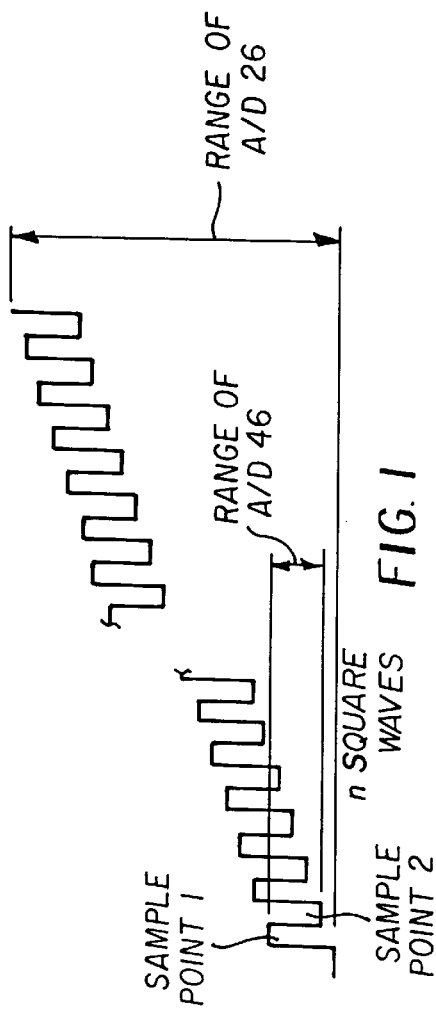
FIG. 1 shows the waveform of the applied voltage signal.
Figure 3:
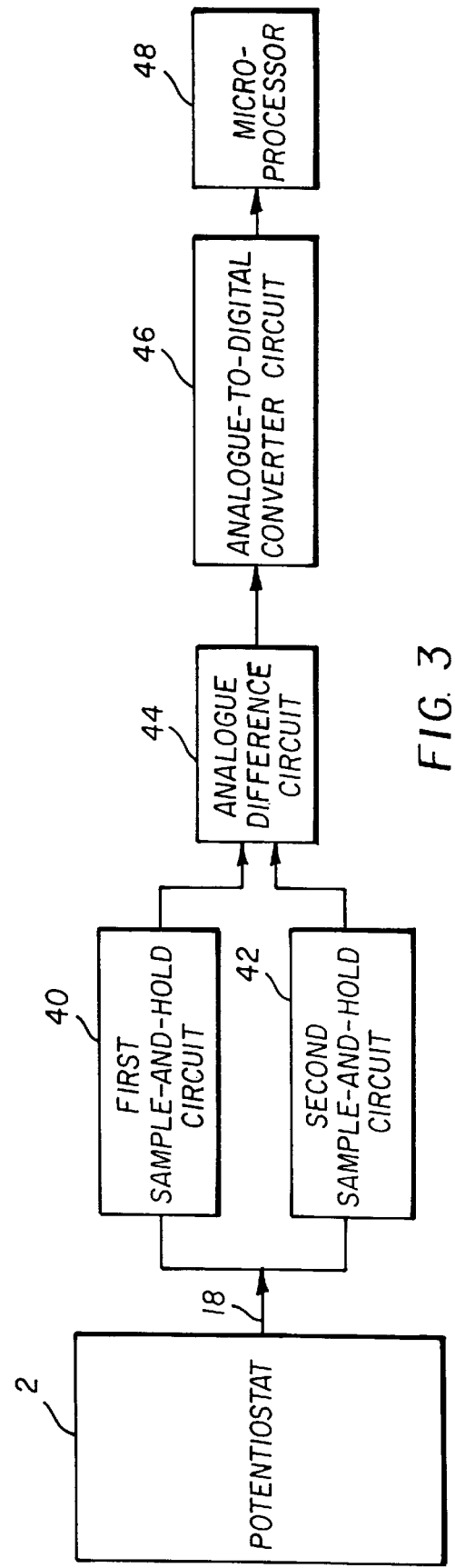
FIG. 3 shows a block diagram of a sampling circuit that is a modification of the circuit of FIG. 2 described above.
Figure 2:
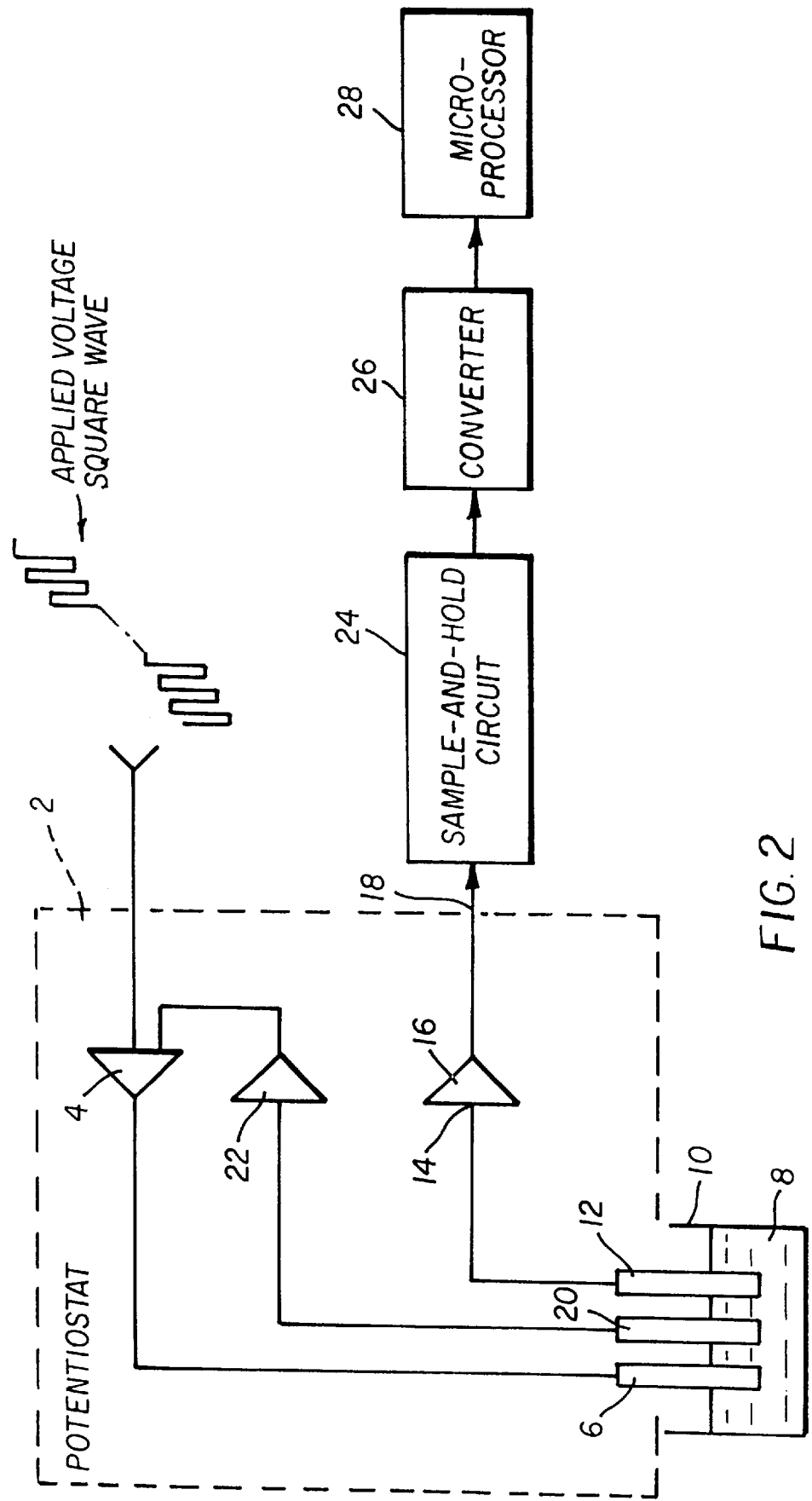
FIG. 2 shows a block diagram of the known sampling circuit.

An applied voltage square wave input is supplied to the three-electrode geometry potentiostat 2 to produce an analogue square wave voltage output on path 18 as described above with reference to FIG. 2. However, in accordance with the invention, the signal on path 18 that arises from sampling at Sample Point 1, i.e. at the peak of the pulse (FIG. 1), is passed to a first sample-and-hold circuit 40. The signal on path 18 that arises from sampling at Sample Point 2, i.e. at the trough of the pulse (FIG. 1), is passed to a second sample-and-hold circuit 42. An analogue difference circuit 44 subtracts the two signals from the sample-and-hold circuits 40,42, and the resulting signal is converted to a digital code in a low cost, 8-bit analogue-to-digital converter circuit 46, before being passed for storage in a microprocessor 48. This process is repeated for successive square waves along the ramp. The sample-and-hold circuits 40,42 remove the large range of the ramp, typically 15 nA to 2 mA, so that only the range of a single square wave current signal (Point 1 to Point 2 in FIG. 1), typically 15 microamps, is applied to the input of the analogue-to-digital converter 46.

In voltage terms, the sampled signals may have a dynamic range as large as ±15V, whereas the measured signals may differ by no more than about 50 microvolts. The present invention will allow accurate resolution of the 50 microvolt signal, as well as being able to deal with the ±15V range, whilst not needing a conventional high bit count, and thus relatively expensive, analogue-to-digital converter.

It is to be understood that although the invention has been exemplified herein in its application to a linear sweep of a square waveform, the concept is generally applicable to other waveforms, whether they be continually increasing, decreasing or otherwise.

Parts List 2 potentiostat
4 amplifier
6 electrodes
8 electrolyte
10 test cell
12 electrolyte
14 input terminal
16 current-to-voltage converter/amplifier
18 path
20 reference electrode
22 amplifier
24 sample-and-hold circuit
26 analog-to-digital converter (AID)
28 microprocessor
40,42 sample-and-hold circuits
44 analog difference circuit
46 analog-to-digital converter circuit
48 microprocessor

What is claimed is:

1. A method of analyzing the concentration of chemicals in a photographic solution comprising the steps of:

applying a square wave voltage to a first electrode immersed in the photographic solution;

collecting current associated with the square wave voltage at a second electrode immersed in the solution;

converting the current to a voltage to provide an output signal for sampling, the output signal being sampled at two different times;

deriving a signal representing the difference in value therebetween and passing the derived signal to analogue to digital converting means thereby producing a derived digital signal; and, storing the derived digital signal and repeating the above steps so as to store a succession of digital signals that are representative of a change in value of the output signal, thus indicating the potentials and thus the concentration of the chemicals within the photographic solution.

2. Apparatus for analyzing the concentration of chemicals in a photographic solution comprising:

at least two electrodes for immersion in the photographic solution;

means for applying a square wave voltage to a first electrode;

means for collecting current associated with the square wave voltage at a second electrode;

means for converting the current to a voltage to provide an output signal for sampling, and a sampling circuit comprising first and second circuit means arranged repetitively to receive and to store a first and a successive second analogue input signal respectively;

means arranged to subtract each of the first and successive second input signals from one another and to derive successive analog difference signals therefrom; and, means arranged to convert the successive analog difference signals into successive digital signals and electronic processing means arranged to receive and to store the successive digital signals.

3. Apparatus according to claim 2 wherein each of said first and second circuit means comprises a sample and hold circuit.

4. Apparatus according to claim 2 wherein the electronic processing means comprises a microprocessor.

5. Apparatus according to claim 2 wherein the means arranged to convert the analog difference signals into digital signals comprise an 8 bit analogue to digital converter.

* * * * *